(12) United States Patent
Nara et al.

(10) Patent No.: US 7,279,737 B2
(45) Date of Patent: Oct. 9, 2007

(54) NONVOLATILE SEMICONDUCTOR MEMORY DEVICE AND METHOD OF MANUFACTURING THE SAME

(75) Inventors: Akiko Nara, Tokyo (JP); Masahiro Koike, Yokohama (JP); Yuichiro Mitani, Miura-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/078,313

(22) Filed: Mar. 14, 2005

(65) Prior Publication Data

US 2005/0275012 A1 Dec. 15, 2005

(30) Foreign Application Priority Data

Jun. 15, 2004 (JP) ............... 2004-177191

(51) Int. Cl.
*H01L 29/788* (2006.01)
(52) U.S. Cl. ............... 257/315; 257/321; 257/E29.304
(58) Field of Classification Search ............... 257/315, 257/316, 321, 324, 325, 410, 411, E27.102, 257/E27.103, E21.18, E21.179, 314, E29.129, 257/E29.3, E29.304; 438/287
See application file for complete search history.

(56) References Cited

U.S. PATENT DOCUMENTS 6,645,882 B1  11/2003 Halliyal et al.
6,914,292 B2 * 7/2005 Specht et al. ............... 257/321
7,001,814 B1 * 2/2006 Halliyal et al. ............. 438/287
2003/0122182 A1  7/2003 Specht et al.

FOREIGN PATENT DOCUMENTS

JP       6-151830      5/1994
JP       3357861      10/2002
JP       2002-539637  11/2002
KR       2003-0065702  8/2003

* cited by examiner

*Primary Examiner*—Minhloan Tran
*Assistant Examiner*—Benjamin Tzu-Hung Liu
(74) *Attorney, Agent, or Firm*—Oblon, Spivak, McClelland, Maier & Neustadt, P.C.

(57) ABSTRACT

A nonvolatile semiconductor memory device includes a gate electrode portion composed of a floating gate electrode formed above a main surface of a semiconductor substrate of a first conductivity type via a tunnel insulating film, an inter-electrode insulating film formed on the floating gate electrode and formed of a stacked structure film of three or more layers formed of two or more types of high-dielectric material, and a control gate electrode formed above the floating gate electrode via the inter-electrode insulating film, and source and drain regions of a second conductivity type which are formed on the main surface of the substrate with the gate electrode portion being arranged between the source and drain regions.

4 Claims, 9 Drawing Sheets

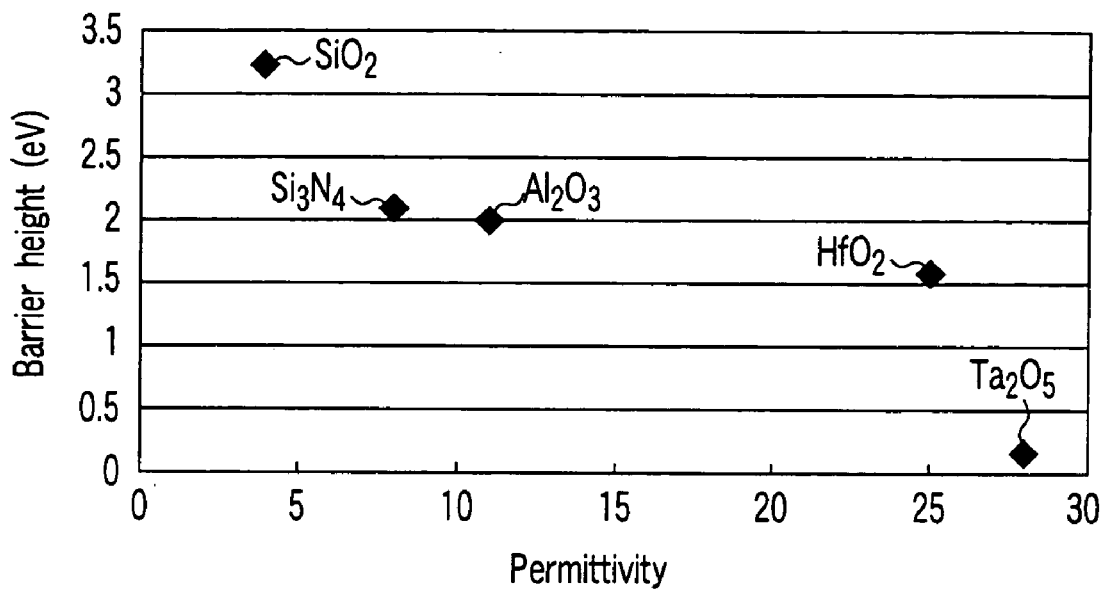
F I G. 1
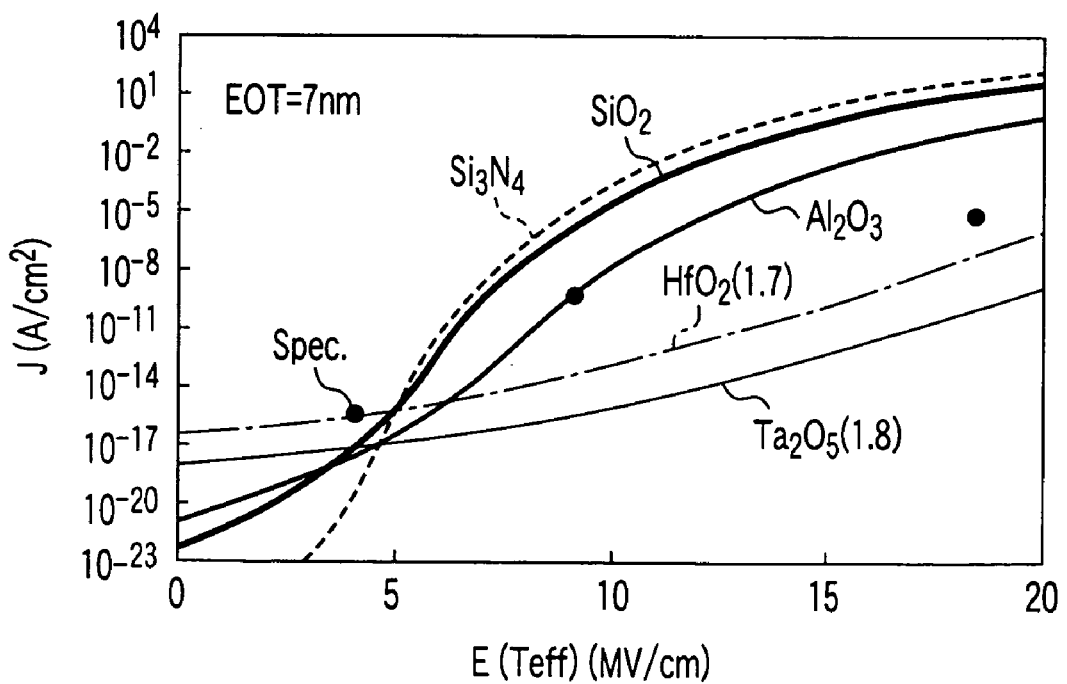
F I G. 2

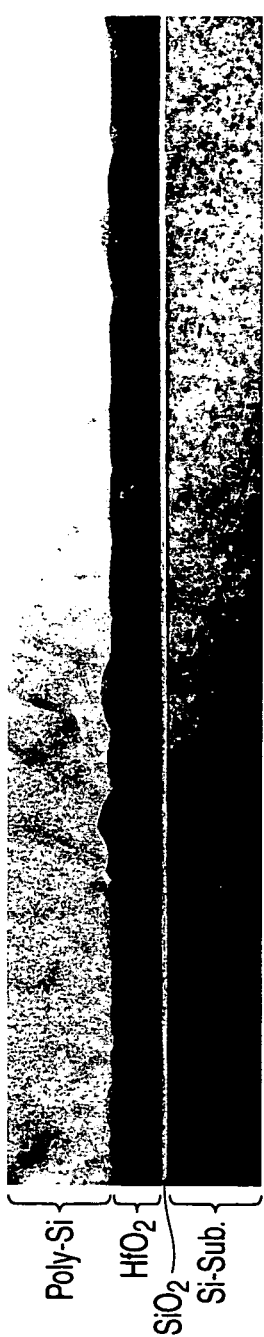
F I G. 20
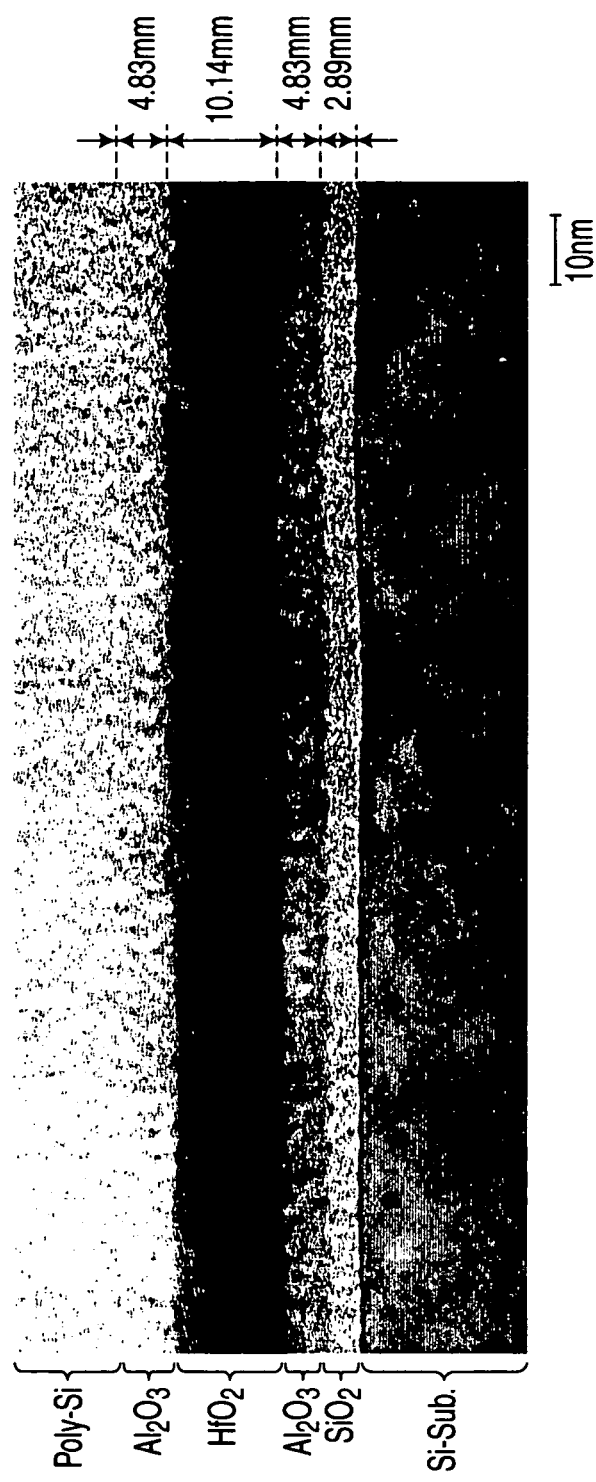
F I G. 21

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2004-177191, filed Jun. 15, 2004, the entire contents of which are incorporated herein by reference.

BACKGROUND OF THE INVENTION

1. Field of the Invention

This invention relates to a nonvolatile semiconductor memory device and a method of manufacturing the same. More particularly, this invention relates to a nonvolatile semiconductor memory device which improves the tunnel insulating film and inter-electrode insulating film in a stacked gate configuration where a floating gate electrode and a control gate electrode are stacked one on top of the other and to a method of manufacturing the nonvolatile semiconductor memory device.

2. Description of the Related Art

A MOS structure with a stacked gate configuration has been used for the memory cells in a NAND nonvolatile semiconductor memory device. The MOS structure with a stacked gate configuration is such that a floating gate electrode is formed above a semiconductor substrate via a tunnel insulating film and a control gate electrode is formed above the floating gate electrode via an inter-electrode insulating film (or an interpoly insulating film). In this type of memory cell, to gain the electric capacitance ratio of the floating gate electrode to the control electrode, an $SiO_2/SiN/SiO_2$ film (hereinafter, referred to as an ONO film) whose permittivity is higher than that of a silicon oxide film has been used as an interpoly insulating film (refer to Jpn. Pat. Appln. KOKAI Publication No. 6-151830).

With the recent miniaturization of memory cells, the application of a material whose permittivity is higher than that of an ONO film as an interpoly insulating film has been under examination. Of the high-dielectric films, an aluminum oxide ($Al_2O_3$) film particularly has a high thermal stability and therefore is less liable to react with polysilicon. Therefore, an aluminum oxide film has good compatibility with the manufacturing process of NAND semiconductor elements and therefore is a promising film for a tunnel insulating film and an interpoly insulating film in the near future (refer to Jpn. Pat. Appln. KOKAI Publication No. 2002-539637).

However, when an aluminum oxide film is used as an interpoly insulating film, the following problem arises: when a high electric field is applied to the interpoly insulating film, the leakage level cannot be suppressed below the memory retaining characteristic.

BRIEF SUMMARY OF THE INVENTION

In accordance with a first aspect of the invention, there is provided a nonvolatile semiconductor memory device comprising:

a gate electrode portion comprising:

a floating gate electrode formed above a main surface of a semiconductor substrate of a first conductivity type via a tunnel insulating film;

an inter-electrode insulating film formed on the floating gate electrode and formed of a stacked structure film of three or more layers formed of two or more types of high-dielectric material; and a control gate electrode formed above the floating gate electrode via the inter-electrode insulating film; and source and drain regions of a second conductivity type which are formed on the main surface of the substrate with the gate electrode portion being arranged between the source and drain regions.

In accordance with a second aspect of the invention, there is provided a nonvolatile semiconductor memory device comprising:

a gate electrode portion comprising:

a tunnel insulating film formed on a main surface of a semiconductor substrate of a first conductivity type and formed of a stacked structure film of three or more layers of two or more types of high-dielectric material;

a floating gate electrode formed on the tunnel insulating film; and;

a control gate electrode formed above the floating gate electrode via an inter-electrode insulating film; and source and drain regions of a second conductivity type which are formed on the main surface of the substrate with the gate electrode portion being disposed between the source and drain regions.

In accordance with a third aspect of the invention, there is provided a nonvolatile semiconductor memory device comprising:

a gate electrode portion comprising:

a floating gate electrode formed above a main surface of a semiconductor substrate of a first conductivity type via a tunnel insulating film;

an inter-electrode insulating film formed of a high-dielectric film including at least two types of metal elements and oxygen (O) which change continuously in a film thickness direction and is distributed symmetrically; and a control gate electrode formed on the inter-electrode insulating film; and source and drain regions of a second conductivity type which are formed on the main surface of the substrate with the gate electrode portion being arranged between the source and drain regions.

In accordance with a fourth aspect of the invention, there is provided a nonvolatile semiconductor memory device comprising:

a gate electrode portion comprising:

a tunnel insulating film formed on a main surface of a semiconductor substrate of a first conductivity type and formed of a high-dielectric film including at least two types of metal elements and oxygen (O) which change continuously in a film thickness direction and is distributed symmetrically;

a floating gate electrode formed on the tunnel insulating film; and a control gate electrode which is formed above the floating gate electrode via an inter-electrode insulating film; and source and drain regions of a second conductivity type which are formed on the main surface of the substrate with the gate electrode portion being arranged between the source and drain regions.

BRIEF DESCRIPTION OF THE SEVERAL VIEWS OF THE DRAWING

FIG. 1 is a characteristic diagram to help explain the relationship between the permittivity of each type of insulating film and the barrier height;

FIG. 2 is a characteristic diagram showing an Electric field-current characteristic obtained for calculations in each type of insulating film;

FIG. 20 shows a photomicrograph of a cross section of a crystal structure in the case of a single layer of a hafnium oxide film; and FIG. 21 shows a photomicrograph of a cross section of a crystal structure in the case of a three-layer structure of an aluminum oxide film/a hafnium oxide film/an aluminum oxide film.

DETAILED DESCRIPTION OF THE INVENTION

Figure 3A:
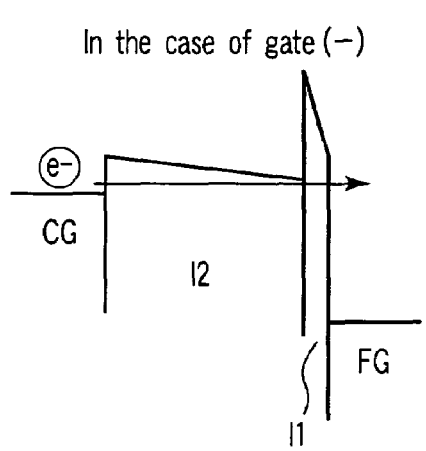
FIGS. 3A to 3C are diagrams to help explain a band structure when a positive and a negative electric field are applied to a two-layer structure of an insulating film.

Before explanation of embodiments of the present invention, the basic principle of the invention will be explained. In the explanation below, permittivity means relative permittivity. That a leakage current is small means that the absolute value of a leakage current is small.

The inventors of the present invention have made memory cells using a hafnium oxide film whose permittivity is higher in place of a conventional aluminum oxide film. In this case, the hafnium oxide film is theoretically capable of suppressing leakage current because of its high permittivity. Actually, however, the leakage current increased and it was found that the hafnium oxide film could not be used as an interpoly insulating film. Although the cause of the increase in the leakage current is not clear, leakage current flowing in a defect in the hafnium oxide film and surface roughness caused by the crystallization of the hafnium oxide film can be considered connected with the increase of the leakage current.

As described above, it was found that, even when an aluminum oxide film was used as the interpoly insulating film of a memory cell with a stacked gate configuration, the following problem arose: leakage current in a high electric field required for the interpoly insulating film could not be decreased sufficiently. In a single hafnium oxide film, leakage current should be suppressed even in both a low electric field and a high electric field in calculations. Actually, however, leakage current develops via a defect in the hafnium oxide film and leakage current seemingly resulting from the surface roughness caused by crystallization appears. Therefore, it was found that there was a problem: even when a single hafnium oxide film was used, it could not be used as an interpoly insulating film.

To overcome these problems, the inventors have carried out research and obtained the following knowledge, thereby completing the present invention.

When a high-dielectric film is used as an interpoly insulating film, a very high electric field is applied during the program operation of the element. When such a high electric field is applied, leakage current flowing in the interpoly insulating layer has to be suppressed to one-tenth or less of the leakage current flowing in a tunnel insulating film. For example, when the film thickness of the tunnel insulating film is 0.75 nm and the coupling ratio of the tunnel insulating film to the interpoly insulating film is 0.58, the electric field applied to the interpoly insulating film is as high as 18 MV/cm. The allowed leakage current in the interpoly insulating film at this time is about $1 \times 10^{-6}$ A/cm$^2$.

In retaining the memory, it is essential to suppress the electrons accumulated in the control gate electrode flowing into the interpoly insulating film in the form of leakage current. Specifically, for example, under the same device conditions as described above, when the electric field applied to the interpoly insulating film is 4 MV/cm, the leakage level of the interpoly insulating film is required to be equal to or less than $1 \times 10^{-16}$ A/cm$^2$. When an element is erased, a negative high electric field ($-16$ MV/cm) is applied. At this time, it is necessary to suppress the leakage current flowing in the interpoly insulating film to $1 \times 10^{-6}$ A/cm$^2$ or less.

As described above, in the interpoly insulating film used in a nonvolatile semiconductor memory device, it is essential to decrease not only leakage current in each of the positive and negative high electric field but also leakage current in a low electric field. Similarly, in the tunnel insulating film, it is essential to decrease not only leakage current in each of the positive and negative high electric fields but also leakage current in a low electric field.

Generally, the dependence of leakage current flowing in a high-dielectric film on the electric field is determined by the barrier height and permittivity of the high-permittivity material selected. The relationship between barrier height and permittivity is such that, the higher the permittivity, the smaller the barrier height tends to be.

As shown in FIG. 1, a silicon oxide film (SiO$_2$) has a permittivity of 3.9 and a barrier height of 3.2 eV. In comparison with this, it has been reported that a silicon nitride film (SiN) has a permittivity of 8 and a barrier height of 2.1 eV, an aluminum oxide film (Al$_2$O$_3$) has a permittivity of 9 to 11 and a barrier height of 2.0 to 2.5 eV, a hafnium oxide film (HfO$_2$) has a permittivity of 20 to 25 and a barrier height of 1.0 to 1.5 eV, and a tantalum oxide film (Ta$_2$O$_5$) has a permittivity of 28 and a barrier height of 0.2 to 1.0 eV.

Although not shown, it has been reported that a yttrium oxide film (Y$_2$O$_3$) has a permittivity of 15 and a barrier height of 2.3 eV, a zirconium oxide film (ZrO$_2$) has a permittivity of 25 and a barrier height of 1.4 eV, a titanium oxide film (TiO$_2$) has a permittivity of 80 to 180 and a barrier height of 0.2 to 1.0 eV, and a lanthanum oxide film (La$_2$O$_5$) has a permittivity of 30 and a barrier height of 2.3 eV.

If the permittivity is high, the physical film thickness becomes greater when the oxide film equivalent film thickness is made constant, with the result that the leakage current decreases. On the other hand, if the permittivity is high, the barrier height decreases. When the barrier height becomes smaller, the probability of tunneling from a higher level than the Fermi level or the probability that electrons will go over the barrier and flow into the conductor becomes higher, with the result that the tunnel current density increases. That is, the leakage current flowing in the film is determined by the decrease in the leakage current due to the high permittivity and the increase in the tunnel current density due to the low barrier height.

To estimate leakage current flowing when each of the above materials was used, leakage current in each of a direct tunnel current and a Fowler Nordheim (FN) tunnel current was calculated using a theoretical calculation approach using WKB approximations. The result of comparing the result of the calculations with the leakage level allowed for an interpoly insulating film is shown in FIG. 2.

In the calculations, it was assumed that the oxide film equivalent film thickness was 7 nm, the effective mass was 0.46 m, and the temperature was 85° C. The three points marked with circles indicate the leakage level allowed for an interpoly insulating film. Comparison of these three points with the result of the calculations showed that, when an aluminum oxide film is used as an interpoly insulating film, the leakage current is suppressed below the allowed leakage level, that is, below the required memory retaining characteristic in a low electric field (4 MV/cm) region. However, in a high electric field (18 MV/cm) region, the leakage current cannot be suppressed below the allowed leakage level in a write operation. Actually, the leakage current characteristic of an aluminum oxide film experimentally measured coincides with the result of the calculations very well.

On the other hand, when a hafnium oxide film is used as an interpoly insulating film, the physical film thickness can be made greater than that of an aluminum oxide film because of its higher permittivity than that of the aluminum oxide film. From the result of the calculations, it is seen that, in the high electric field (18 MV/cm), the leakage current can be suppressed sufficiently below the leakage level required in a write operation. In the low electric field (4 MV/cm) region, too, the leakage current is almost at the required leakage level.

However, the result of actually making measurements using only a hafnium oxide film showed that the leakage current increases by the order of several digits. The reason for this seems to be that a leakage current is flowing via a defect in addition to the tunnel leakage current assumed in calculations. Moreover, it is conceivable that crystallization progresses as a result of the heat treatment after the film formation and a huge crystal grain grows, resulting in surface roughness, which permits the leakage current to increase because an electric field concentration occurs at the grain boundary. For this reason, it is impossible to apply only a hafnium oxide film to an interpoly insulating film.

Furthermore, the examination made by the inventors showed that a two-layer structure of two types of dielectric film is insufficient for the reason explained below. In the case of a two-layer structure, when electrons are injected from a film whose permittivity is higher, leakage current can be suppressed. However, when electrons are injected from a film whose permittivity is lower, leakage current cannot be suppressed. This is because a high electric field is applied to the lower permittivity film and electrons tunnel through the triangular potential of the lower-permittivity film, which allows current to flow directly into the two-layer interpoly insulating film without the influence of the higher-permittivity film.

Figure 3B:
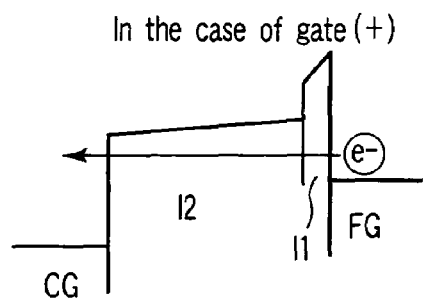
Figure 3C:
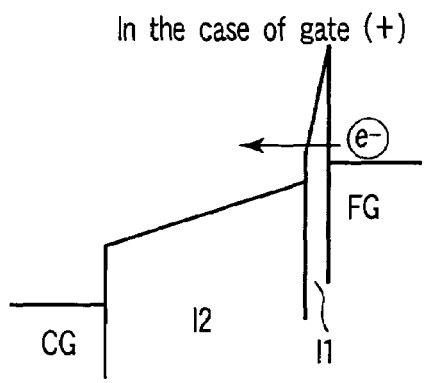

FIGS. 3A to 3C show band diagrams schematically illustrating the above concept. Since a positive and a negative high electric field are applied to the interpoly insulating film in a write operation and an erase operation, it is essential to suppress the positive and negative leakage characteristics. However, in the two-layer structure, since the leakage current never fails to increase in one of the positive and negative electric fields, the effect of suppressing the leakage current is insufficient.

Specifically, suppose an insulating film (I1) and an insulating film (I2) are placed between a control gate (CG) and a floating gate (FG). When the CG side is negative (−), leakage current is suppressed by the barrier of I1 and I2 as shown in FIG. 3A. When the CG side is positive (+) and under a low electric field, leakage current is suppressed by I1 and I2 as shown in FIG. 3B. However, when the CG side is positive (+) and under a high electric field, I2 does not function as a barrier as shown in FIG. 3C. Therefore, when the CG side is positive (+) and under a high electric field, the merit of the two-layer structure cannot be gained.

To overcome this problem, the inventors have come up with the idea of using as an interpoly insulating film a high-dielectric stacked structure which uses two or more types of high-dielectric film and has a stacked structure of three layers or more. The structure is composed of a stacked layer of high-dielectric films A, B, and C. The permittivities of the high-dielectric films A, B, C are ∈1, ∈2, ∈3, their barrier heights are φ1, φ2, φ3, and their oxide film equivalent film thickness are EOT1, EOT2, EOT3, respectively. The material of the high-dielectric film A is made equal to that of the high-dielectric film C. Thus, it follows that ∈1=∈3, φ1=φ3, and EOT1=EOT3.

Figure 4A:
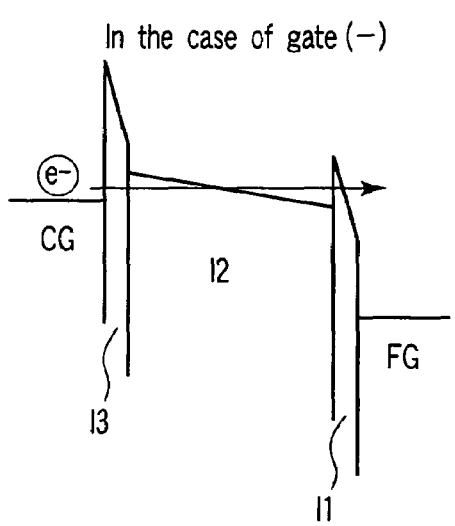
FIGS. 4A to 4C are diagrams to help explain a band structure when a positive and a negative electric field are applied to a three-layer structure of an insulating film.
Figure 4B:
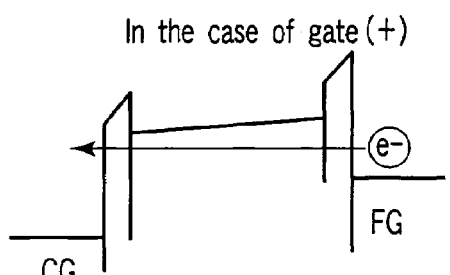
Figure 4C:
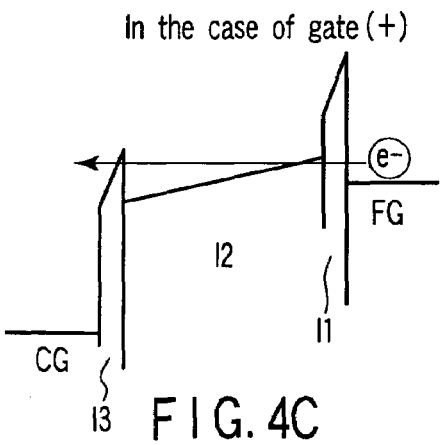

FIGS. 4A to 4C schematically show band diagrams of this case. In the case of a three-layer structure, it is expected that leakage current can be suppressed in both a positive electric field and a negative electric field. Specifically, when the CG side is negative (−), leakage current is suppressed by the barrier of I3 as well as the barrier of I1 and I2 as shown in FIG. 4A. When the CG side is positive (+) and under a low electric field, leakage current is suppressed by I3 as well as I1 and I2 as shown in FIG. 4B. When the CG side is positive (+) and under a high electric field, I1 and I3 function as a barrier as shown in FIG. 4C, which produces the effect of suppressing leakage current. Here, making I1 equal to I3 makes it possible to realize an insulating film structure symmetrical with respect to the thick film direction, which enables leakage current to be suppressed effectively with the same barrier structure, regardless of whether the CG side is positive (+) or negative (−).

Figure 5:
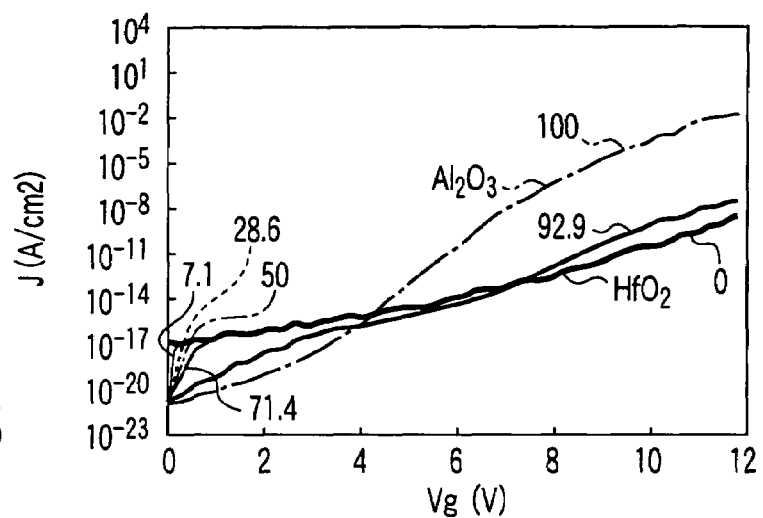
FIG. 5 is a characteristic diagram showing a negative voltage-current characteristic in the case of a two-layer structure of an aluminum oxide film and a hafnium oxide film.
Figure 6:
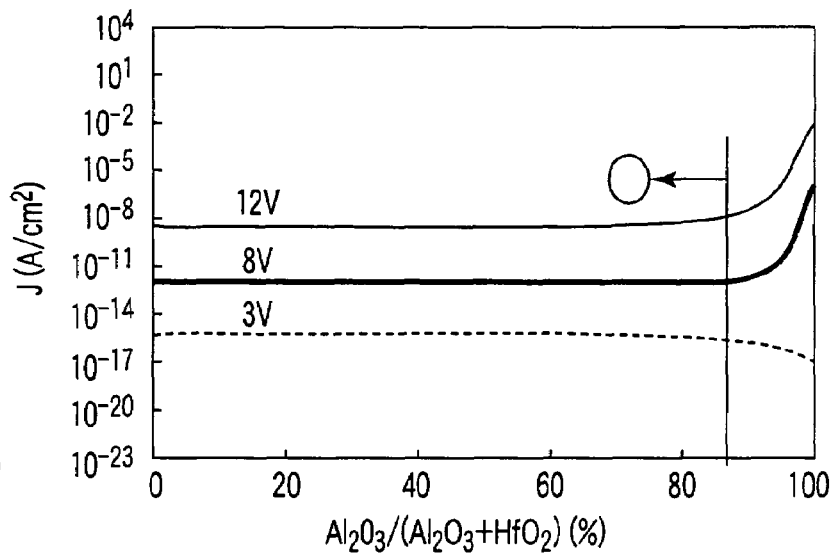
FIG. 6 is a characteristic diagram showing the relationship between the proportion of the aluminum oxide film and the leakage current in the case of a two-layer structure of an aluminum oxide film and a hafnium oxide film.
Figure 7:
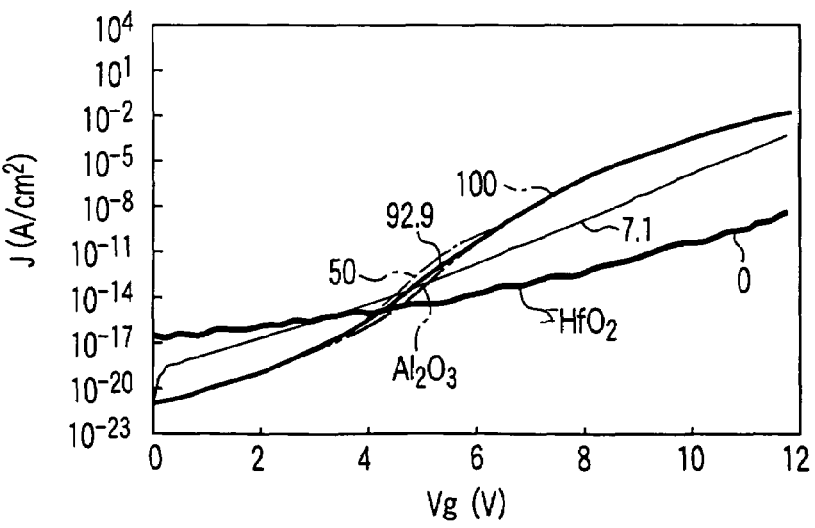
FIG. 7 is a characteristic diagram showing a positive voltage-current characteristic in the case of a two-layer structure of an aluminum oxide film and a hafnium oxide film.
Figure 8:
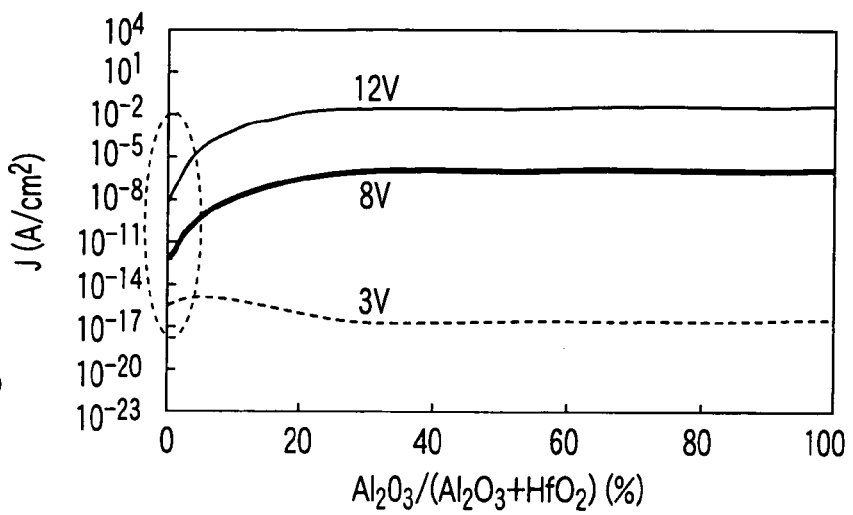
FIG. 8 is a characteristic diagram showing the relationship between the proportion of the aluminum oxide film and the leakage current in the case of a two-layer structure of an aluminum oxide film and a hafnium oxide film.

As concrete examples, FIGS. 5 to 8 show the results of calculating leakage current flowing in the film in a positive electric field and a negative electric field when an aluminum oxide film and a hafnium oxide film are used. A hafnium oxide film was used as the lower layer and an aluminum oxide film was used as the upper layer. Then, calculations were done when the gate electrode on the upper layer was positive and negative. The permittivity and barrier height of the film were the same as those in the above explanation. In calculations, an effective mass of 0.46 m and a temperature of 85° C. were used. The total equivalent oxide thickness was fixed to 7 nm. FIGS. 5 and 6 show a case where a negative (−) electric field was applied to the CG side. FIGS. 7 and 8 show a case where a positive (+) electric field was applied to the CG side. FIGS. 5 and 7 show a leakage current in the gate electric field in the form of the composition of aluminum oxide (0 to 100%). FIGS. 6 and 8 show the percentage of the total equivalent film thickness (7 nm) occupied by the aluminum oxide equivalent film thickness on the abscissa.

From the result of FIG. 6, it is seen that, when a negative electric field is applied to the CG side (gate−), the required leakage level can be fulfilled in the case of 90% or less aluminum oxide film. In contrast, from the result of FIG. 8, it is seen that, when a positive electric field is applied to the CG side (gate+), leakage current cannot be suppressed unless the percentage of the aluminum oxide film to the total film thickness is several percent or less and therefore leakage current depends on whether the electric field is positive or negative. A case where the upper layer and the lower layer are replaced with each other corresponds to a case where the direction of one electric field is replaced with that of the other.

Figure 9:
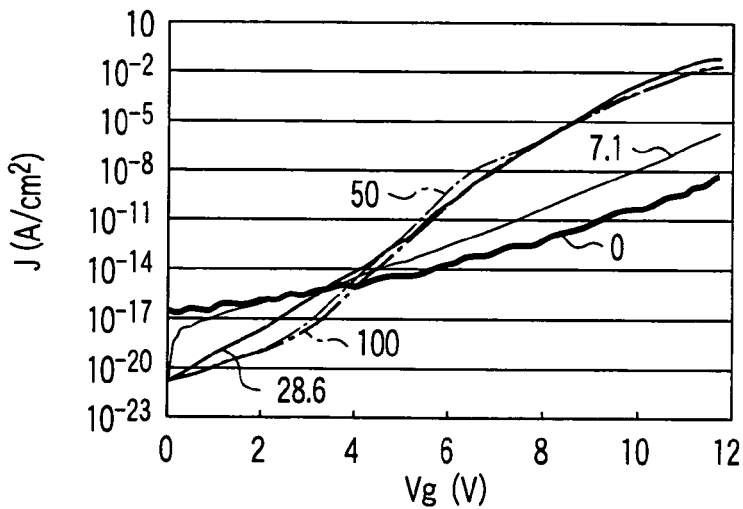
FIG. 9 is a characteristic diagram showing a voltage-current characteristic in the case of a three-layer structure of an aluminum oxide film/a hafnium oxide film/an aluminum oxide film.
Figure 10:
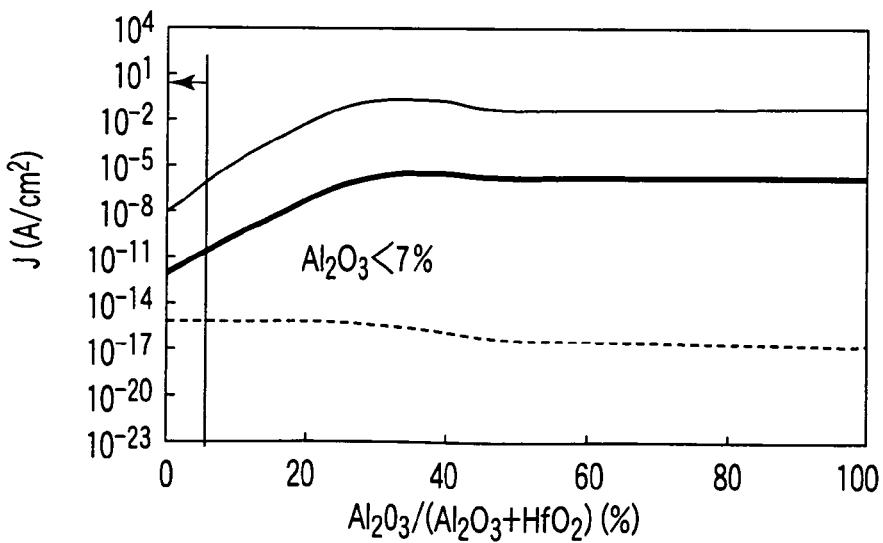
FIG. 10 is a characteristic diagram showing the relationship between the proportion of the aluminum oxide film and the leakage current in the case of a three-layer structure of an aluminum oxide film/a hafnium oxide film/an aluminum oxide film.
Figure 11:
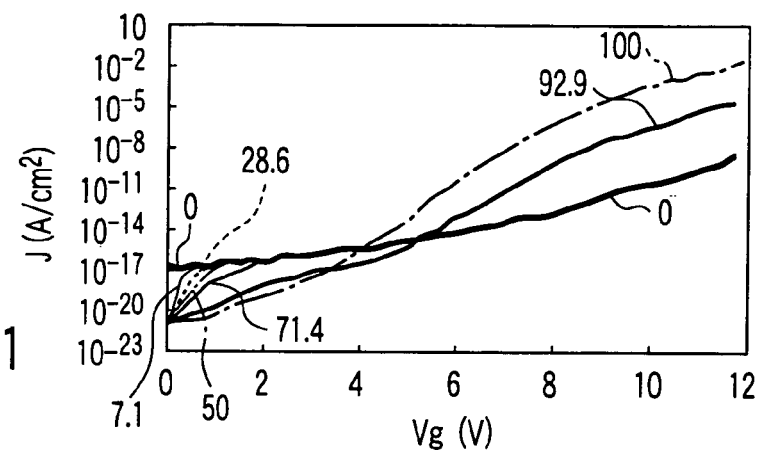
FIG. 11 is a characteristic diagram showing a voltage-current characteristic in the case of a three-layer structure of a hafnium oxide film/an aluminum oxide film/a hafnium oxide.
Figure 12:
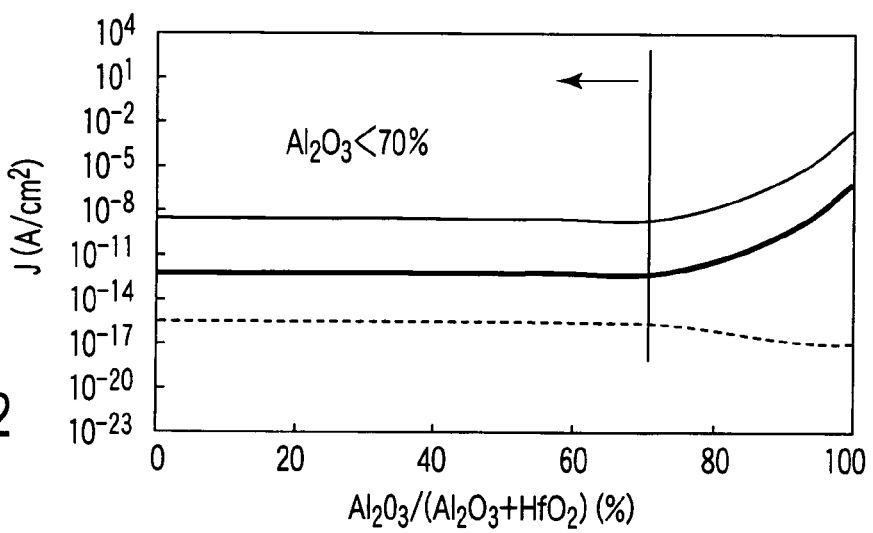
FIG. 12 is a characteristic diagram showing the relationship between the proportion of the aluminum oxide film and the leakage current in the case of a three-layer structure of a hafnium oxide film/an aluminum oxide film/a hafnium oxide film.

FIGS. 9 to 12 show the results of calculations in the case of a three-layer stacked structure. FIGS. 9 and 10 show a case where a hafnium oxide film was sandwiched vertically between aluminum oxide films. Conversely, FIGS. 11 and 12 show a case where an aluminum oxide film was sandwiched vertically between hafnium oxide films on the assumption that the film thickness of the upper layer and that of the lower layer are constant. In this case, too, the total equivalent oxide film thickness was fixed to 7 nm.

As seen from these figures, in a case where a hafnium was sandwiched vertically between aluminum oxide films, the leakage current satisfied the requirement, only when the total of the upper and lower aluminum oxide films was 7% or less. On the other hand, in a case where an aluminum oxide film was sandwiched vertically between hafnium oxide films, the leakage current satisfied the requirement, only when the percentage of the aluminum oxide film was 70% or less.

As described above, even with a combination of two types of films where leakage current increases in either a positive electric field or a negative electric field, leakage current in each of a positive and a negative electric field can be suppressed by using a three-layer structure. That is, it is possible to combine the higher permittivity of one film with the higher barrier height of the other, that is, the advantages of both films. In addition, a stacked-layer film of two or more types of films makes it possible to suppress not only crystallization occurred in the hafnium oxide film but also leakage current resulting from crystallization. Moreover, the region of the composition which can suppress leakage current differs depending on the combination in the three-layer structure. From this, it is seen that the best condition range for the best film thickness ratio of three layers exists.

To reduce leakage current by increasing the physical film thickness, the first and second high-dielectric films have to have a permittivity of 8 or more. From the viewpoint of combining the higher permittivity of one film and the higher barrier height of the other film, that is, the advantages of both films, it is desirable that the first high-dielectric film should have a relatively high barrier height and that the second high-dielectric film should have a sufficiently higher permittivity than that of the first high-dielectric film, although its barrier height may be low.

Hereinafter, the present invention will be explained in detail using embodiments of the invention.

FIRST EMBODIMENT

Figure 13:
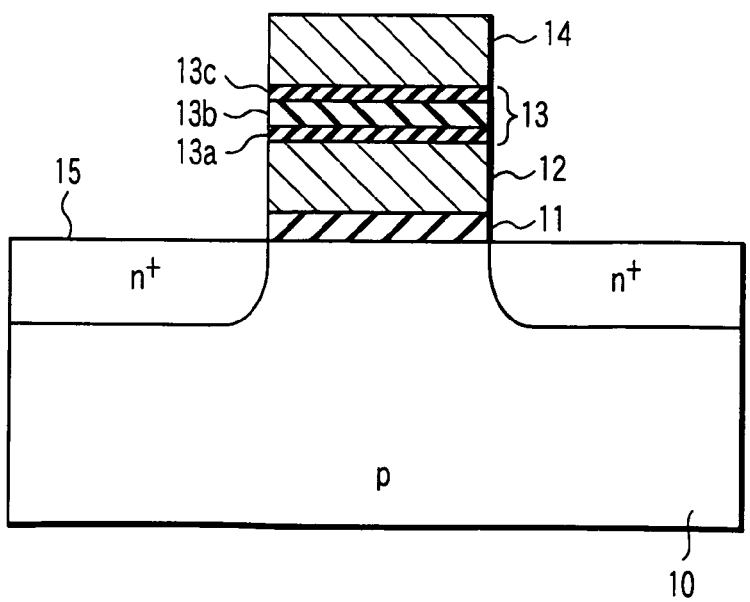
FIG. 13 is a sectional view showing a schematic configuration of a nonvolatile semiconductor memory device according to a first embodiment of the present invention.

FIG. 13 is a sectional view schematically showing the configuration of a nonvolatile semiconductor memory device according to a first embodiment of the present invention.

On a p-type Si substrate 10, a floating gate electrode 12 made of polysilicon is formed via a tunnel oxide film (or tunnel insulating film) 11 by thermal oxidation. Then, above the floating gate electrode 12, a control gate electrode 14 made of polysilicon is formed via an interpoly insulating film (or inter-electrode insulating film) 13. Here, the inter-poly insulating film 13 has a three-layer structure where a hafnium oxide film ($HfO_2$) 13b is sandwiched between aluminum oxide films ($AL_2O_3$) 13a, 13c. The film thickness of the hafnium oxide film 13b is 30 nm and each of the aluminum oxide films 13a, 13c is 1 nm.

Figure 14A:
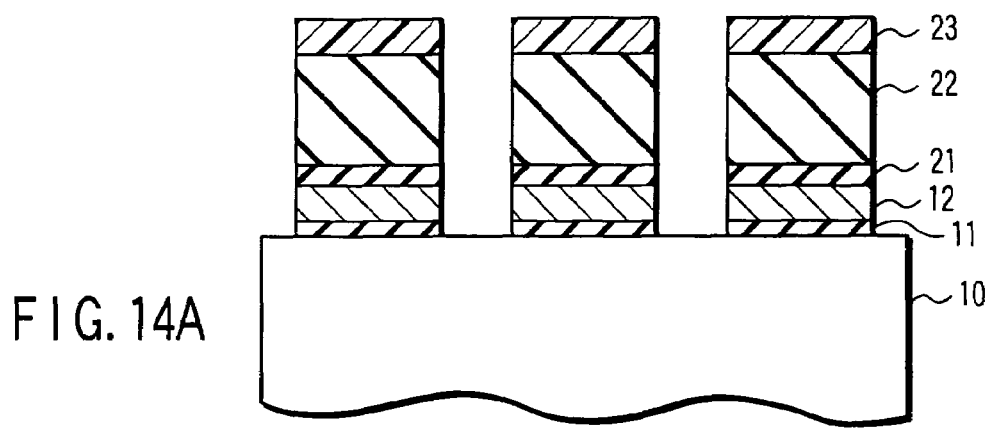
FIGS. 14A to 14D are sectional views to help explain the steps of fabricating a nonvolatile semiconductor memory device of the first embodiment.
Figure 14B:
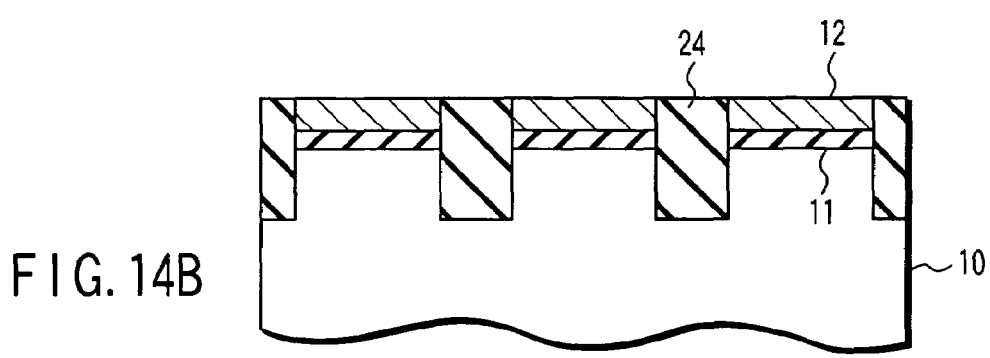
Figure 14C:
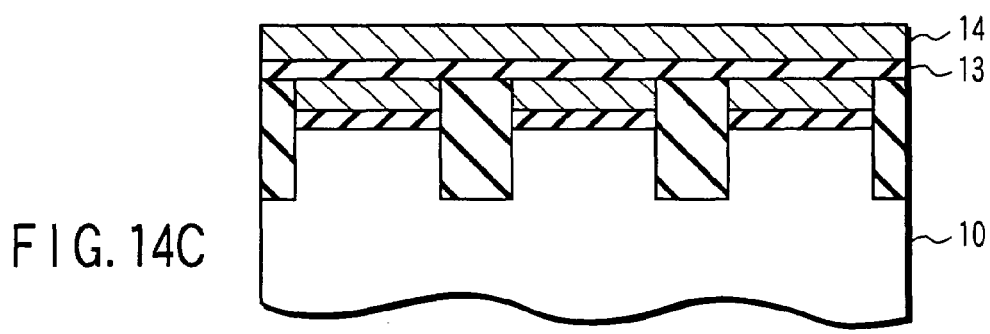
Figure 14D:
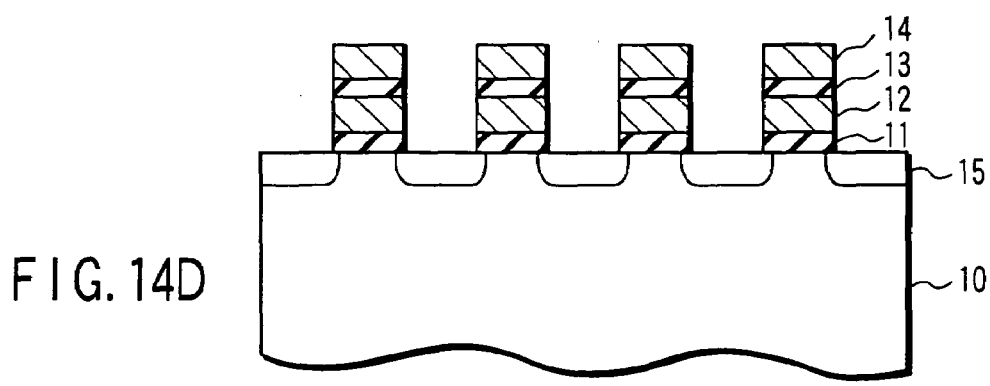

FIGS. 14A to 14D are sectional views to help explain the steps of fabricating a nonvolatile semiconductor memory device of the first embodiment. FIGS. 14A to 14C show a cross section of a MOSFET in the channel width direction and FIG. 14D shows a cross section of the MOSFET in the channel length direction. This figure is based on the assumption of a NAND cell unit composed of a plurality of memory cells connected in series. In addition, a sputtering method is used as a method of forming a plurality of high-dielectric films.

First, as shown in FIG. 14A, a tunnel oxide film 11, a polysilicon film making a floating gate electrode 12, an SiN film 21, and a TEOS film 22 are formed on the main surface of a p-type Si substrate 10. Thereafter, with a resist pattern 23 as a mask, the films 22, 21, 12, 11 are selectively etched. In this step, the polysilicon film is etched so as to separate the floating gate electrode 12 between cells adjacent to each other in the word line direction.

Specifically, after a tunnel oxide film 11 is formed to a thickness of 7.3 nm on the surface of the Si substrate 10, a polysilicon film 12 making a floating gate electrode 12 is formed to a thickness of 60 nm on the tunnel oxide film 11 by CVD techniques. Then, on the polysilicon film, an SiN film 21 is formed to a thickness of 150 nm by LPCVD techniques. On the SiN film, an $SiO_2$ film 22 is deposited to a thickness of 150 nm by LPCVD techniques using TEOS, followed by heat treatment. Thereafter, on the $SiO_2$ film 22, a photoresist pattern 23 is formed.

Next, with the photoresist pattern 23 as a mask, the $SiO_2$ film 22 is etched by reactive ion etching. Then, with the $SiO_2$ film 22 as a mask, the SiN film 21 is etched by reactive ion etching. Then, with the SiN film 21 as a mask, the polysilicon film making the floating gate electrode 12 is etched by reactive ion etching. Thereafter, the tunnel oxide film 11 is etched by reactive ion etching.

Next, as shown in FIG. 14B, after the substrate 10 is selectively etched with the SiN film 21 as a mask, thereby making element isolating grooves, an $SiO_2$ film 24 is formed so as to be buried in the grooves. More specifically, after the $SiO_2$ film 24 is deposited on the entire surface of the substrate by CVD techniques, the $SiO_2$ film 24 is etched by CMP techniques until the surface of the SiN film 21 has been exposed. Thereafter, the SiN film 21 is removed by wet etching.

Next, as shown in FIG. 14C, a three-layer interpoly insulating film 13 is deposited by a sputtering method explained later. On the interpoly insulating film 13, a polysilicon film making a control gate electrode 14 is deposited to a thickness of 200 nm.

Next, as shown in FIG. 4D, using a mask (not shown), the polysilicon films making the control gate electrode 14 and floating gate electrode 12 are selectively etched into a word line pattern. Thereafter, phosphorus is ion-implanted into the Si substrate 10 at a dose of $2 \times 10^{15}$ $cm^{-2}$ with an acceleration voltage of, for example, 40 KeV, thereby forming a high-impurity-concentration n+-type source-drain region 15. This completes a NAND nonvolatile memory cell.

In the first embodiment, the interpoly insulating film 13 is formed as follows. First, to suppress the growth of low-permittivity interface layer, the pretreatment of dilute hydrofluoric acid finish is performed. Then, depending on conditions, such metal as aluminum (Al), titanium nitride (TiN), molybdenum (Mo), or tungsten (W) is evaporated on the surface.

Figure 15:
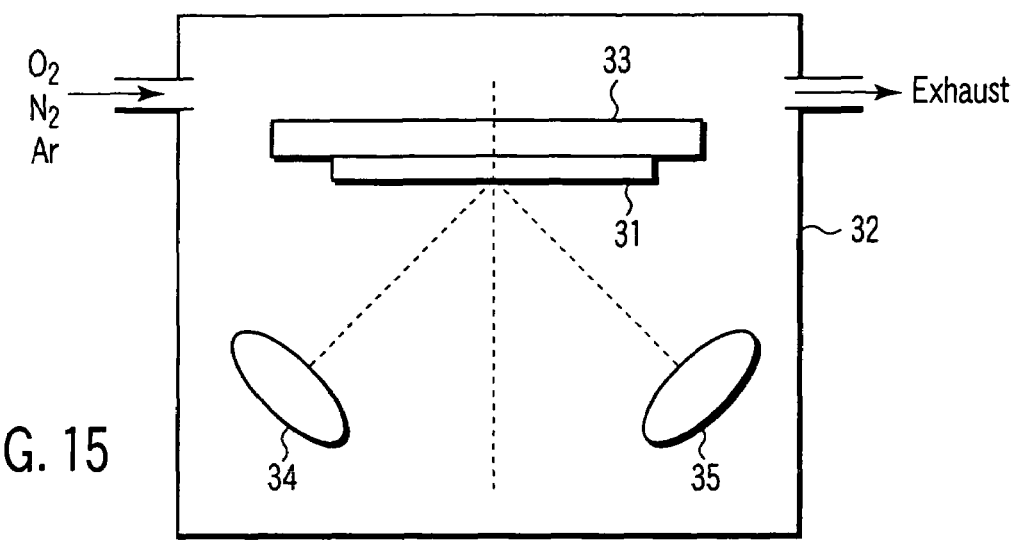
FIG. 15 is a sectional view schematically showing the configuration of a sputtering apparatus for depositing a high-dielectric film.

Next, using a sputtering apparatus as shown in FIG. 15, an interpoly insulating film is formed on the pretreated substrate by sputtering techniques. Specifically, a specimen 31 on whose surface a polysilicon film is deposited as a floating gate electrode is introduced into a chamber 32 of the sputtering apparatus and is positioned above a circle lamp heater 33. A plurality of targets 34, 35 are placed with an inclination of 45° to the specimen 31 and are set at the same time. For instance, an aluminum oxide film is used as the target 34 and a hafnium oxide film is used as the target 35.

While in the embodiment, the aluminum oxide film target and the hafnium oxide film target have been used, films may be formed by a sputtering method using such a metal target as an aluminum target or a hafnium target, and the oxidation reaction of oxygen. In addition, films may be formed by using a pre-alloyed one type or more of HfAlOx target. Alternatively, films may be formed in an atmosphere of oxygen.

Furthermore, a stacked structure with a different composition may be formed by controlling the ambient gas flow rate in forming a film using a single target. Moreover, in addition to a stacked structure with three types or more of different compositions, a film structure whose composition changes continuously may be formed.

Figure 19:
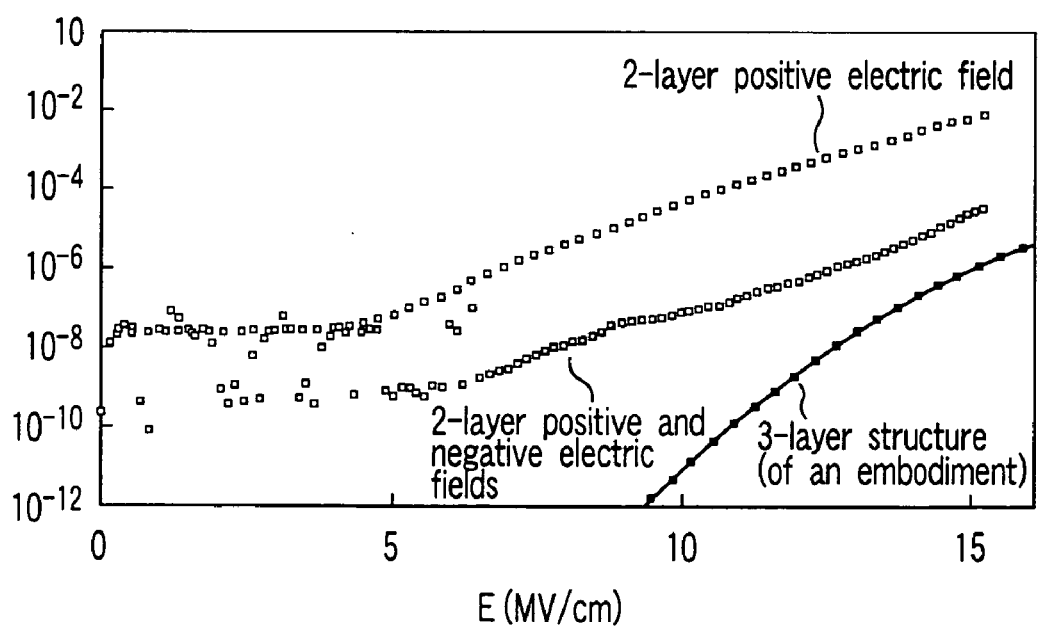
FIG. 19 is a diagram showing the result of evaluating the leakage current in a high dielectric film acting as an interpoly insulating film.

FIG. 19 shows the result of evaluating leakage current in a high-dielectric film used as an interpoly insulating film formed in the first embodiment. FIG. 19 further shows a two-layer structure of an aluminum oxide film and a hafnium oxide film. From FIG. 19, it is seen that, in the case of the two-layer structure, leakage current is suppressed in a negative electric field, whereas leakage current increases sharply in a positive electric field. In contrast, when an interpoly insulating film is formed so as to have a thee-layer structure, leakage current is suppressed, regardless of whether the electric field is positive or negative.

Furthermore, it has been verified that use of a stacked structure increased the crystallization temperature of a hafnium oxide film, which suppressed the crystallization. FIGS. 20 and 21 show these effects. FIG. 20 shows a photomicrograph of a cross section of a single-layer structure of a hafnium oxide film. FIG. 21 shows a photomicrograph of a cross section of a three-layer structure of an aluminum oxide film/a hafnium oxide film/an aluminum oxide film. In the case of a single layer of a hafnium oxide film, a surface roughness caused by crystallization as shown in FIG. 20 was observed. However, use of a three-layer stacked structure using aluminum oxide films suppressed the surface roughness remarkably as shown in FIG. 21.

In the case of a film where the hafnium concentration gradient and the aluminum concentration gradient are made symmetric, too, it has been verified that leakage current flowing in the film was suppressed in both of the positive and negative electric fields and the crystallization temperature rose.

According to the first embodiment, in the nonvolatile semiconductor memory device with a stacked gate configuration, the interpoly insulating film is formed so as to have a stacked structure of aluminum oxide films and a hafnium oxide film, that is, a three-layer structure composed of a hafnium oxide film sandwiched between aluminum oxide films. The three-layer structure makes it possible to combine the higher permittivity of the hafnium oxide film and the higher barrier height of the aluminum oxide film, that is, the advantages of both films. This enables leakage current to be reduced in both of the positive and negative high electric fields and further enables leakage current to be suppressed in a wide high electric field region ranging from a low electric field to a high electric field which would be difficult in a single high-dielectric film. Consequently, it is possible to contribute to the realization of a highly reliable nonvolatile semiconductor memory device which features a good leakage characteristic and is capable of coping with future miniaturization.

Furthermore, in the first embodiment, the hafnium oxide film 13b is sandwiched between the aluminum oxide films 13a, 13b and the parts in contact with the polysilicon electrodes 12, 14 on the top and bottom of the interpoly insulating film 13 are made of an aluminum oxide film. Therefore, the interpoly insulating film 13 will never react with the polysilicon electrodes 12, 14. In addition, the percentage of the total film thickness of the aluminum oxide film in the interpoly insulating film 13 is about 6%, fulfilling the condition of 7% or less shown in FIG. 8, which produces a sufficient leakage current reduction effect.

SECOND EMBODIMENT

While in the first embodiment, an interpoly insulating film has been formed using a sputtering apparatus, an interpoly insulating film may be formed using an ALD apparatus in a similar manner.

Figure 16:
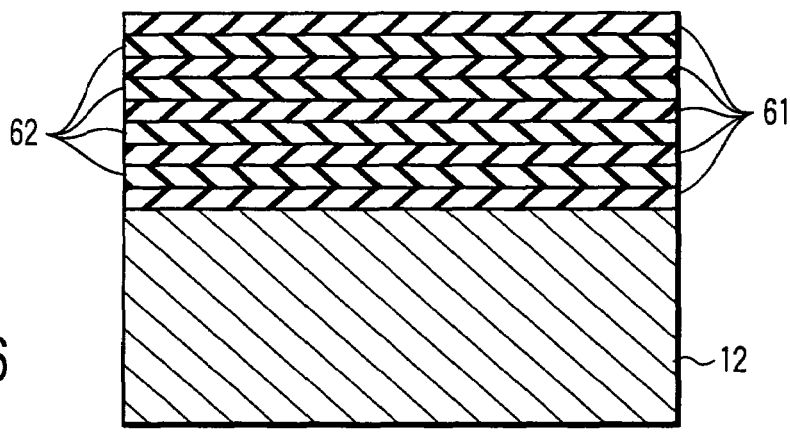
FIG. 16 is a sectional view of an aluminum oxide film and a hafnium oxide film nano-laminated together to help explain a nonvolatile semiconductor memory device according to a second embodiment of the present invention.

In a second embodiment of the present invention, it is possible to form such a multilayer structure as has an aluminum oxide film 61 and a hafnium oxide film 62 deposited alternately by repeating a film formation and an oxidation process at an atom layer level on a floating gate electrode 12 as shown in FIG. 16.

Figure 17:
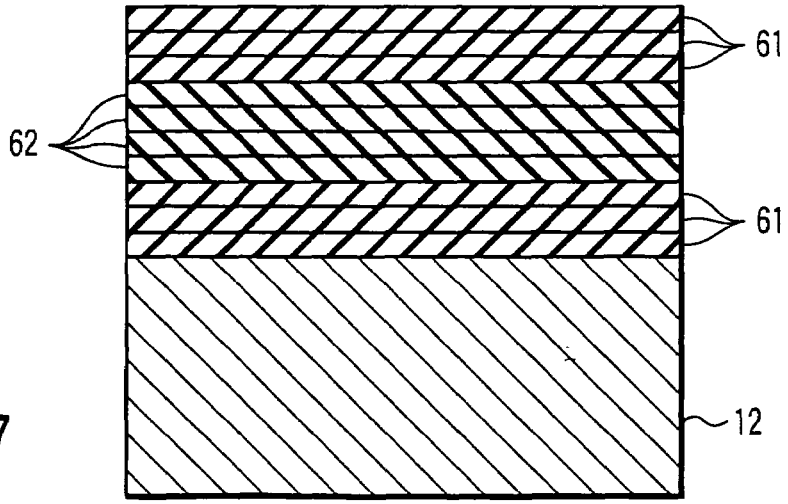
FIG. 17 is a sectional view showing an example of depositing an aluminum oxide film and a hafnium oxide film a specific number of times, which helps explain the nonvolatile semiconductor memory device of the second embodiment.

Furthermore, as shown in FIG. 17, when a film formation and an oxidation process at an atom layer level are repeated, an aluminum oxide film 61 is deposited a specific number of times, then a hafnium oxide film 62 is deposited a specific number of times, and thereafter an aluminum oxide film 61 is deposited a specific number of times. As a result of these depositions, a three-layer stacked structure is essentially formed.

Even with this configuration, it is possible to combine the higher permittivity of the hafnium oxide film 62 and the higher barrier height of the aluminum oxide film 61, that is, the advantages of both films and therefore the same effect as that of the first embodiment is produced.

THIRD EMBODIMENT

While in the first and second embodiments, an interpoly insulating film has a stacked structure, a film whose composition changes continuously may be used as an interpoly insulating film.

Figure 18:
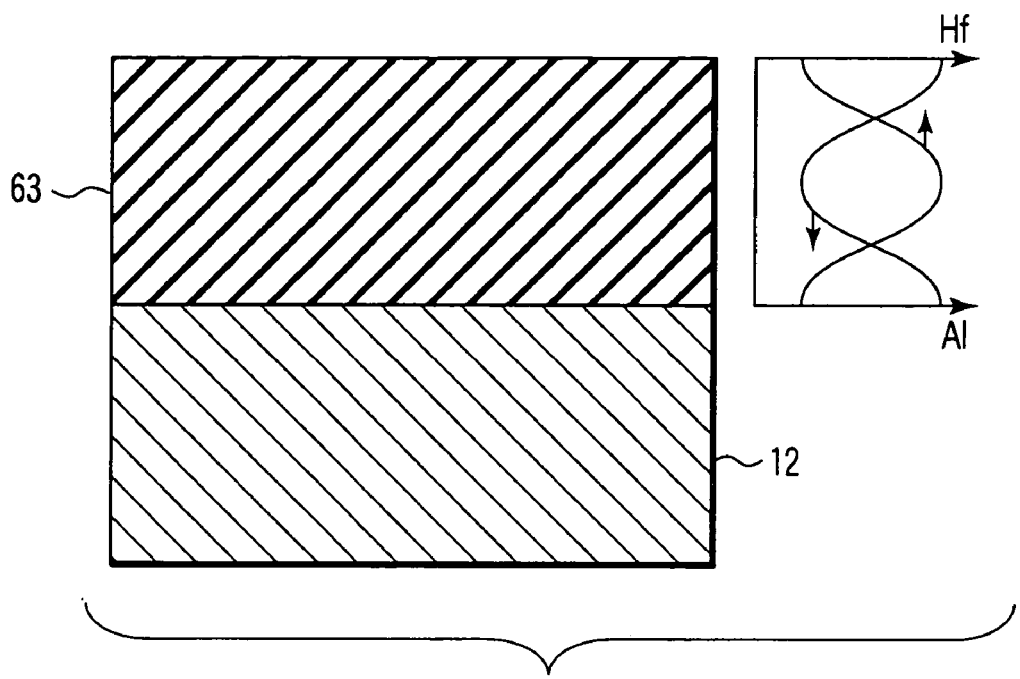
FIG. 18 is a sectional view showing an example of forming a symmetric composition of aluminum and hafnium with respect to the film thickness direction, which helps explain a nonvolatile semiconductor memory device according to a third embodiment of the present invention.

Specifically, as shown in FIG. 18, an aluminum oxide film and a hafnium oxide film are formed in a specific ratio using an ALD apparatus. The ratio of aluminum (Al) to hafnium (Hf) in the course of forming a film is changed, which enables the concentration in the film in the film thickness direction to be changed continuously. The film is particularly formed at an atom level using an ALD apparatus, which realizes an HfAlOx film 63 whose composition essentially changes continuously. In addition, use of a CVD apparatus makes it possible to form a similar interpoly insulating film.

Even with this configuration, it is possible to combine the higher permittivity of the hafnium oxide film and the higher barrier height of the aluminum oxide film, that is, the advantages of both films and therefore the same effect as that of the first embodiment is produced.

Experiments conducted by the inventors have shown that a good leakage current characteristic was obtained, provided that the aluminum concentration at each of the interfaces of the floating gate electrode 12 and control gate electrode 14 is 70% or more and the average hafnium concentration in the HfAlOx film 63 is 30% or more.

Modification

The present invention is not limited to the above embodiments. While in the embodiments, the hafnium oxide film has been sandwiched between the aluminum oxide films, an aluminum oxide film may be sandwiched between hafnium oxide films. In this case, as shown in FIG. 12, the film thickness percentage of the aluminum oxide film may be made as relatively large as 70% or less, which makes it easier to increase a design margin.

While in the embodiments, the inter-electrode insulating film has been formed so as to have a stacked structure or to allow its composition to change continuously, a tunnel insulating film may be formed so as to have such a configuration in place of the inter-gate insulating film. The tunnel insulating film may be formed so as to have a stacked structure of three layers or more or a structure with an in-film concentration gradient symmetric with the film thickness direction, which produces the same effects as those of the embodiments. Furthermore, both of the inter-electrode insulating film and the tunnel insulating film may be formed so as to have a stacked structure or to allow its composition to change continuously. With such a film, a better leakage current reduction effect can be expected. When a stacked-layer film of the present invention is applied to both of the inter-electrode insulating film and tunnel insulating film, it is desirable that the tunnel insulating film should have an equivalent film thickness of 6 nm or less obtained by converting the film thickness into that of a silicon oxide film on the basis of permittivity and that the inter-electrode insulating film should have an equivalent film thickness of 10 nm or less obtained by converting the film thickness into that of a silicon oxide film on the basis of permittivity.

Furthermore, the stacked structure film constituting the inter-electrode insulating film or tunnel insulating film is not limited to an aluminum oxide film or a hafnium oxide film. For instance, an yttrium oxide film, a zirconium oxide film, a tantalum oxide film, a titanium oxide film, or a lanthanum oxide film may be used. Moreover, the invention is not restricted to two types of these high-dielectric films. For instance, three or more types of the high-dielectric films may be stacked one on top of another.

In addition, when the composition of a high-dielectric film is changed continuously, elements constituting the film are not limited to the materials described in the third embodiment. The elements have only to include oxygen (O) and at least two of the following metal elements: aluminum (Al), hafnium (Hf), yttrium (Y), zirconium (Zr), tantalum (TA), titanium (Ti), lanthanum (La), and silicon (Si).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a gate electrode portion comprising:
   a floating gate electrode formed above a main surface of a semiconductor substrate of a first conductivity type via a tunnel insulating film;
   an inter-electrode insulating film formed of a high-dielectric film including at least two types of metal elements (Al, Hf) and oxygen (O), a concentration of the metal elements changing continuously in a film thickness direction and being distributed symmetrically; and
   a control gate electrode formed on the inter-electrode insulating film; and
   source and drain regions of a second conductivity type which are formed on the main surface of the substrate with the gate electrode portion being arranged between the source and drain regions.

2. The nonvolatile semiconductor memory device according to claim 1, wherein the inter-electrode insulating film has a concentration gradient of Hf that is high in its center with reference to the film thickness direction, and a concentration gradient of Al that is high in its outer portions with reference to the film thickness direction.

3. A nonvolatile semiconductor memory device comprising:

a gate electrode portion comprising:

a tunnel insulating film formed on a main surface of a semiconductor substrate of a first conductivity type and formed of a high-dielectric film including at least two types of metal elements (Al, Hf) and oxygen (O), a concentration of the metal elements changing continuously in a film thickness direction and being distributed symmetrically;

a floating gate electrode formed on the tunnel insulating film; and a control gate electrode which is formed above the floating gate electrode via an inter-electrode insulating film; and source and drain regions of a second conductivity type which are formed on the main surface of the substrate with the gate electrode portion being arranged between the source and drain regions.

4. The nonvolatile semiconductor memory device according to claim 3, wherein the tunnel insulating film has a concentration gradient of Hf that is high in its center with reference to the film thickness direction, and a concentration gradient of Al that is high in its outer portions with reference to the film thickness direction.

* * * * *